(12) United States Patent
Morris et al.

(10) Patent No.: US 6,608,752 B2
(45) Date of Patent: Aug. 19, 2003

(54) ADAPTIVE HEAT SINK FOR ELECTRONICS APPLICATIONS

(75) Inventors: Garron Koch Morris, Whitefish Bay, WI (US); Kamlesh Mundra, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/682,587

(22) Filed: Sep. 24, 2001

(65) Prior Publication Data

US 2003/0058619 A1 Mar. 27, 2003

(51) Int. Cl.7 .................................................. H05K 7/20
(52) U.S. Cl. ................. 361/700; 62/259.2; 165/104.33; 174/15.2
(58) Field of Search ........................ 62/259.2; 174/15.2; 165/80.3, 80.4, 185, 104.26, 104.33, 272, 277; 257/714, 722; 361/703, 704, 699, 700, 717–719; 29/890.03, 890.032, 890.046; 313/634; 345/57

(56) References Cited

U.S. PATENT DOCUMENTS

| | | | |
|---|---|---|---|
| 4,019,098 A | * | 4/1977 | McCready et al. ......... 361/700 |
| 4,667,876 A | * | 5/1987 | Negishi .................. 237/12.3 A |
| 4,709,754 A | * | 12/1987 | Chu et al. .................... 165/133 |
| 4,912,548 A | * | 3/1990 | Shanker et al. ............. 257/715 |
| 5,107,330 A | * | 4/1992 | Dahringer ................... 257/718 |
| 5,420,769 A | | 5/1995 | Ahlgren et al. |
| 5,667,003 A | * | 9/1997 | Mahdjuri-Sabet ........... 165/274 |
| 5,798,908 A | | 8/1998 | Hertzberger et al. |
| 5,875,096 A | * | 2/1999 | Gates .......................... 361/704 |
| 5,895,868 A | * | 4/1999 | Giammaruti et al. |
| 6,045,240 A | | 4/2000 | Hochstein |
| 6,154,116 A | | 11/2000 | Sorenson |
| 6,239,677 B1 | | 5/2001 | Ramakrishnan et al. |
| 6,255,925 B1 | | 7/2001 | DiMarco et al. |
| 6,333,772 B1 | * | 12/2001 | Mori et al. ................. 349/161 |
| 6,400,571 B1 | * | 6/2002 | Kimura et al. .............. 361/704 |
| 6,425,752 B1 | * | 7/2002 | Check ......................... 425/526 |

* cited by examiner

*Primary Examiner*—Gerald Tolin
(74) *Attorney, Agent, or Firm*—Donald S. Ingraham; Christian G. Cabou

(57) ABSTRACT

A heat sink for a compact, integral lamp system comprises a bimetal strip or a bimetal heat pipe containing a liquid. With temperature change, the bimetal strip or pipe flexes toward one metal or the other, depending on the physical properties of the particular metals. The deformation of the strip causes heat sink fins to press against the surface of the ballast wall, thereby significantly reducing or eliminating the air gaps therebetween and thus more effectively removing heat from the ballast.

4 Claims, 4 Drawing Sheets

ADAPTIVE HEAT SINK FOR ELECTRONICS APPLICATIONS

BACKGROUND OF INVENTION

Developments in higher wattage, compact integral lighting systems (i.e., integral lamp and ballast systems) are resulting in ballast heat densities that test the limits of traditional free-convection cooling methods. Disadvantageously, discrete component life is limited by operating temperature. In an exemplary application, an integral ceramic metal halide (CMH) lamp uses a heat sink to transfer heat from the devices comprising the electronic ballast to the inside wall of the ballast's plastic housing. Typically, there are significant air gaps between the fins and interior walls, which gaps reduce the effectiveness of heat removal as temperature of the electronic devices increases. Furthermore, the increase in temperature ultimately reduces the overall reliability of the ballast electronics.

Accordingly, there is a need for innovative thermal management and packaging techniques capable of handling higher heat dissipation requirements and for enabling higher-power and more compact integral lamps.

SUMMARY OF INVENTION

A heat sink for a compact, integral lamp system comprises a bimetal strip or a bimetal heat pipe. The bimetal strip comprises two thin strips of metal bonded lengthwise together. With temperature change, the bimetal strip flexes toward one metal or the other, depending on the physical properties of the particular metals. The deformation of the strip causes heat sink fins to press against the surface of the ballast wall, thereby significantly reducing or eliminating the air gaps between the heat sink fins and ballast wall and thus more effectively removing heat from the ballast.

A bimetal heat pipe comprises two pieces of metal bonded together to form a pipe with a liquid contained therein. With temperature change, the bimetal pipe, or container, flexes in a certain direction, depending on the physical properties of the particular metals. The metal that expands more under heat will bend toward the other metal, causing a physical deformation of the pipe. The liquid inside the bimetal pipe tends to boil at the hot end and condense at the cool end, thereby transferring heat away from the ballast components.

DETAILED DESCRIPTION

Figure 1:
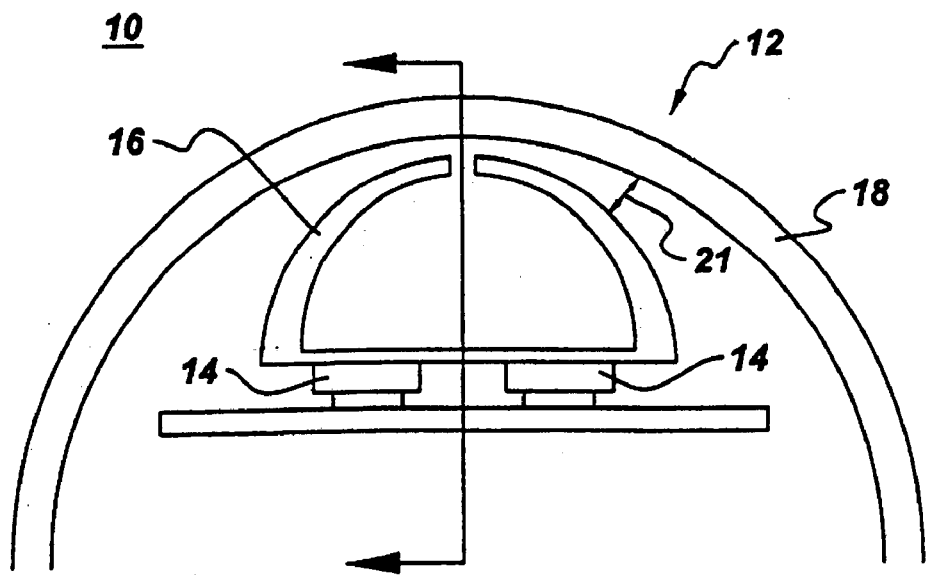
FIG. 1 illustrates in cross section an exemplary integral lamp and ballast configuration with a gap between the heat sink and ballast wall.

FIG. 1 illustrates an exemplary integral lamp and ballast system 10. By way of illustration, lamp and ballast system 10 comprises a ceramic metal halide (CMH) lamp 12 and electronic ballast 14. The integral lamp system 10 also comprises a metal heat sink 16 for transferring heat from the devices of the electronic ballast to the wall 18 of a ballast housing, typically comprised of plastic. Heat sink 16 typically comprises fins (not shown) of a type known in the art. As shown in FIG. 1, there is a gap 21 between heat sink 16 and wall 18.

Figure 2:
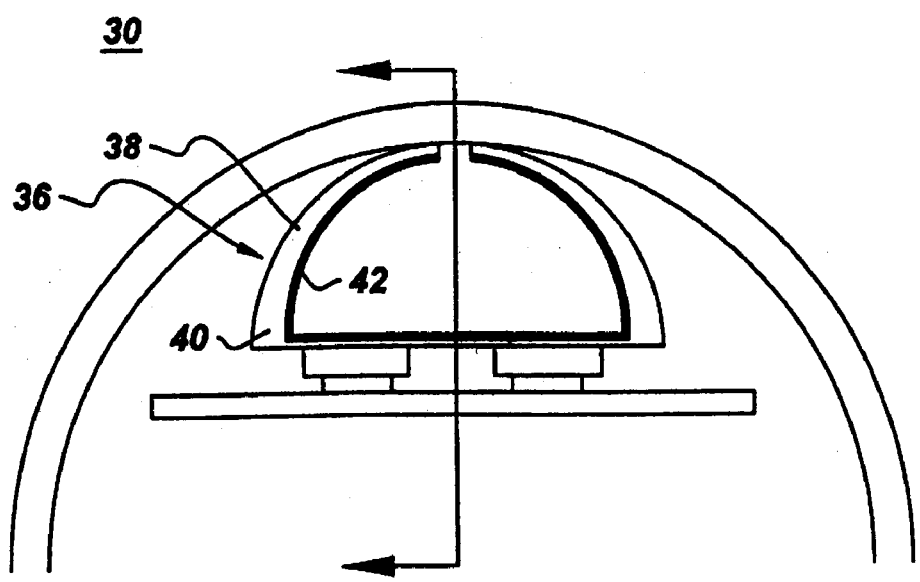
FIG. 2 illustrates in cross section an exemplary integral lamp and ballast configuration in accordance with a preferred embodiment of the present invention.

FIG. 2 illustrates an exemplary integral and lamp ballast system 30 having a heat sink 36 comprising a bimetal strip 38. Bimetal strip 38 comprises two elongated strips of metal 40 and 42 bonded lengthwise to each other. With temperature change, the bimetal strip flexes toward one of the metals, depending on the physical properties of the particular metals. In particular, the metal that characteristically expands more than the other under heating conditions will bend toward the other one, causing a physical deformation of the strip. This deformation presses the heat sink (e.g., including fins (not shown)) against the inside wall of the plastic housing, significantly reducing the thermal resistance otherwise caused by an air gap and thereby effectively conducting heat away from electronic ballast components.

An exemplary bimetal strip comprises copper and zinc. In this example, copper expands more than zinc under heating conditions. Alternatively, the heat sink may comprise a shape-memory alloy, such as, for example, copper aluminum nickel. As still another alternative, the heat sink may comprise a trimetal strip.

Advantageously, using a bimetal strip as a heat sink results in an integral lamp system capable of adapting to increases in temperature. For example, if the temperature of the devices increase due to abrupt changes in the environment, the deflection force and pressure increase. Since thermal contact resistance is inversely proportional to contact pressure, the contact resistance decreases, quickly reducing device temperature. In addition, a bimetal heat sink is capable of adapting to changes in manufacturing or assembly tolerances between the electronic ballast and lamp base.

Figure 3:
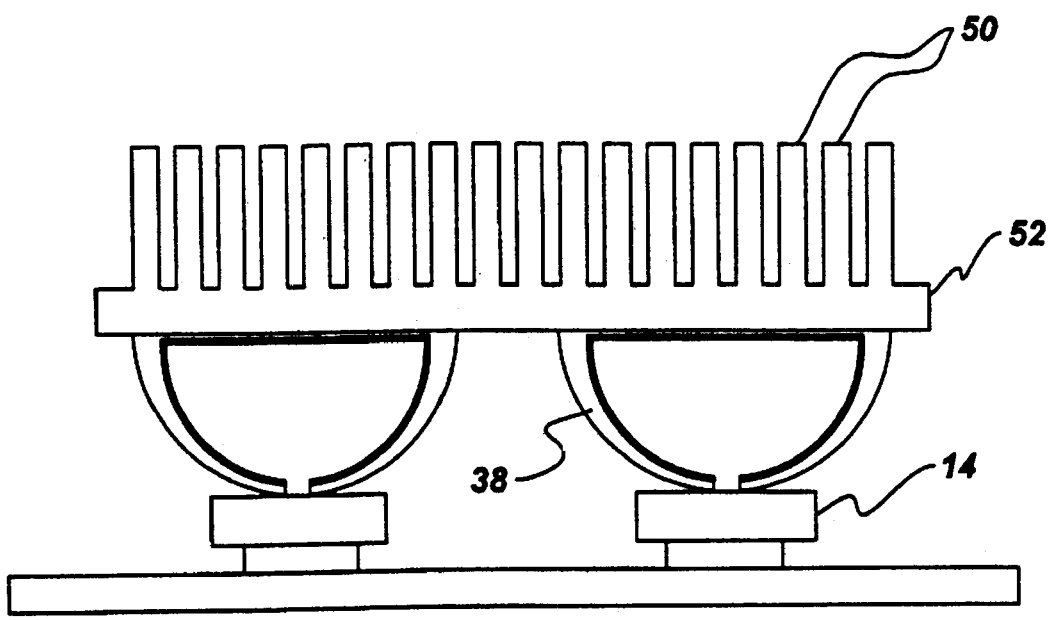
FIG. 3 illustrates an alternative embodiment of the heat sink of FIG. 2.

In an alternative embodiment, as shown in FIG. 3, a heat sink comprising a bimetal strip also comprises bimetal fins 50 mechanically attached to a metal heat sink base 52 (e.g., copper or aluminum) for avoiding thermal expansion problems between the heat sink base and the electronic components of the ballast.

Figure 4:
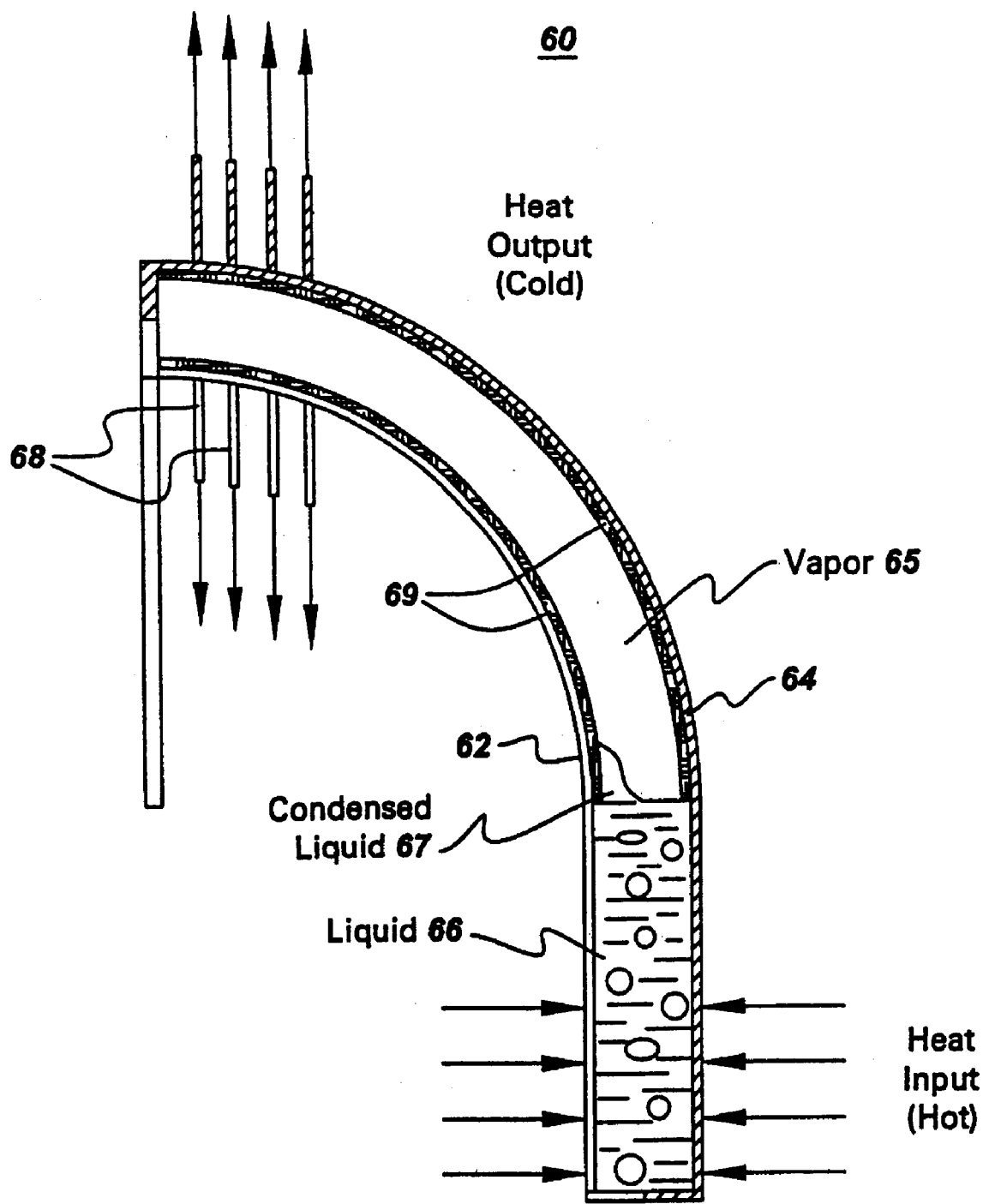
FIG. 4 illustrates a heat pipe constructed in accordance with a preferred embodiment of the present invention.

FIG. 4 illustrates another alternative embodiment of an adaptive heat sink 60. Heat sink 60 comprises a bimetal container, referred to herein as a heat pipe. In particular, heat pipe 60 comprises two types of metal 62 and 64 configured as a pipe with a liquid 66 contained therein. With temperature change, the bimetal container, or pipe, flexes toward one metal or the other, depending on the physical properties of the metals. That is, the metal that expands more under heat bends toward the other metal, causing physical deformation of the heat pipe. The liquid inside the bimetal container tends to boil to form vapor 65 at the hot end and condenses to form liquid 67 at the cool end. In a preferred embodiment, heat sink 60 comprises fins 68. In an alternative embodiment, a wick material 69, such as in a mesh configuration, may be affixed to each metal for the purpose of pumping the working fluid from the condenser end to the evaporator end using capillary action.

An exemplary bimetal pipe 60 comprises copper and zinc with water contained therein. An exemplary wick material 69 comprises sintered powder metal.

An exemplary heat pipe is constructed by using two metals to form a preferably elongated bimetal container having an open end. The two metals are joined to close the container at one end by roll bonding, for example. Wick material 69 may be affixed to each metal side of the container. The container is evacuated and filled with enough liquid to saturate the wick. The open end is then pinch-sealed.

Figure 5:
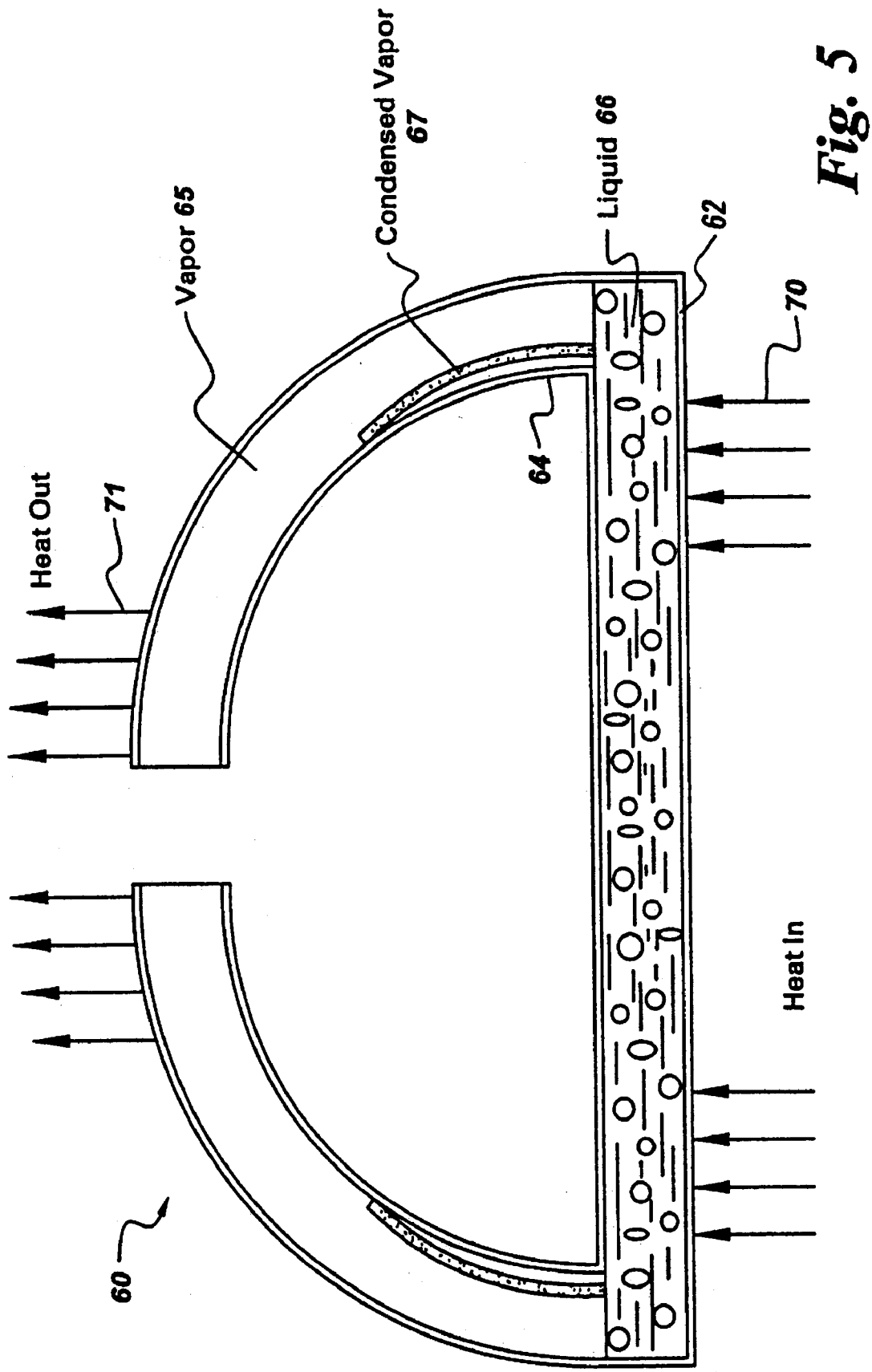
FIG. 5 illustrates a heat pipe such as that of FIG. 3 in an integral lamp and ballast application.

FIG. 5 illustrates application of heat sink 60 in an integral lamp and ballast assembly. The bimetal container presses against the inside surface of the lamp base, thereby avoiding or eliminating the air gap and thus significantly reducing the thermal resistance between the fins and bimetal heat pipe. Heat is transferred from the ballast components to the wall of the lamp via two-phase cooling, thereby substantially reducing temperature of the components and thus increasing reliability thereof. As illustrated in FIG. 5, heat is transferred via vapor movement from the ballast electronics to the ballast wall. In FIG. 5, arrows 70 and 71 represent the heat transfer; i.e., arrows 70 represent heat into the heat sink from the ballast components, and arrows 71 represent heat directed out of the ballast by the heat sink. Advantageously, the bimetal heat pipe is capable of adapting to changes in manufacturing or assembly tolerances between the electronic ballast and the lamp base.

Although the adaptive heat sink has been described herein with particular reference to integral lamp and ballast systems, it is to be understood that the adaptive heat sink has a plurality of other electronics applications, e.g., as a bimetal trip unit in a circuit breaker.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A heat sink system for an electronic system, comprising: a heat pipe comprising a container comprising at least two metal portions attached together at two ends and having a space therebetween for holding a liquid, the metal portions each having predetermined thermal characteristics, the heat pipe being situated adjacent to the electronic system and being configured such that in operation of the electronic system, the heat pipe reconfigures, in response to heat generated by the electronic system, so as to conduct heat away from the electronic system and causing the liquid to tend to boil at one end of the heat pipe and condense at the other end and result in a transfer of heat to a heat sink.

2. The heat sink system of claim 1, further comprising wick material affixed to at least one of the metal portions.

3. The heat sink system of claim 1, wherein the heat sink further comprises heat sink fins.

4. The heat sink system of claim 1, wherein the electronic system comprises an electronic ballast in an integral lamp and ballast system.

* * * * *